(12) United States Patent
Ivrii et al.

(10) Patent No.: US 8,909,579 B2
(45) Date of Patent: Dec. 9, 2014

(54) IDENTIFYING INVARIANT CANDIDATES BASED ON PROOFS

(75) Inventors: Alexander Ivrii, Haifa (IL); Arie Matsliah, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 642 days.

(21) Appl. No.: 13/195,873

(22) Filed: Aug. 2, 2011

(65) Prior Publication Data

US 2013/0035908 A1   Feb. 7, 2013

(51) Int. Cl.
*G06N 5/02* (2006.01)
*G06F 17/50* (2006.01)

(52) U.S. Cl.
CPC .......... *G06F 17/5081* (2013.01); *G06F 17/504* (2013.01)
USPC ........................................................ 706/46

(58) Field of Classification Search
CPC .............. G06F 17/504; G06F 11/3608; G06F 11/3684; G06F 17/5031; G06F 2217/84; G06F 17/11; G06F 17/5018; G06F 17/10; G06F 17/5009; G06F 17/5022; G06F 17/5045; G06F 1/12; G06F 2217/06; G06F 2217/16; G06F 9/44589; G06F 9/5066
USPC ........................................................ 716/106
See application file for complete search history.

(56) References Cited

U.S. PATENT DOCUMENTS 6,944,838 B2 * 9/2005 McMillan ...................... 716/106
7,406,405 B2 * 7/2008 McMillan et al. .............. 703/2
7,742,907 B2 * 6/2010 Gupta et al. .................... 703/14
2011/0010139 A1 * 1/2011 Fuhrmann et al. ............. 703/2
2011/0178970 A1 * 7/2011 Fuhrmann et al. ............ 706/46

OTHER PUBLICATIONS

Gianpiero Cabodi et al., "Speeding up model checking by exploiting explicit and hidden verification constraints", Date 2009: 1686-1691.
Gianpiero Cabodi et al., "Strengthening Model Checking Techniques With Inductive Invariants", IEEE Trans. on CAD of Integrated Circuits and Systems 28(1): 154-158 (2009).
Michael L. Case et al., "Automated Extraction of Inductive Invariants to Aid Model Checking", FMCAD 2007: 165-172.
Jason Baumgartner et al., "Scalable conditional equivalence checking: An automated invariant-generation based approach", FMCAD 2009: 120-127.
Aaron R. Bradley, "k-Step Relative Inductive Generalization", CoRR abs/1003.3649: (2010).

(Continued)

*Primary Examiner* — Stanley K Hill
(74) *Attorney, Agent, or Firm* — Ziv Glazberg

(57) ABSTRACT

Candidate invariants are selected from a proof of a property. In some exemplary embodiments, a proof of a property with respect to a bounded model having a bounded number of cycles may be obtained. The bounded model may comprise an initial axiom and a transition relation axiom. The proof of the property is a Directed Acyclic Graph (DAG). Each non-leaf node of the DAG is deducible from its child nodes. A root of the DAG is the property. Leaves of the DAG are associated with an axiom of the bounded model. A set of candidate invariants may be selected from the DAG. A subset of the set of candidates may be determined such that the subset comprises invariants which are held during each cycle of an unbounded model, wherein the unbounded model is an unbounded version of the bounded model. The invariants may be utilized for model checking of the unbounded model.

20 Claims, 3 Drawing Sheets

(56) References Cited

OTHER PUBLICATIONS

Aaron R. Bradley and Zohar Manna, "Property-directed incremental invariant generation", Formal Asp. Comput. 20 (4-5): 379-405 (2008).

Oded Fuhrmann and Shlomo Hoory, "On Extending Bounded Proofs to Inductive Proofs", CAV 2009: 278-290.

Niklas Eén and Niklas Sörensson, "Temporal induction by incremental SAT solving", Electr. Notes Theor. Comput. Sci. 89(4): (2003).

Niklas Eén et al., "A Single-Instance Incremental SAT Formulation of Proof- and Counterexample-Based Abstraction", CoRR abs/1008.2021: (2010).

Thalmaier Max et al., "Analyzing K-step Induction to Compute Invariants for SAT-based Property Checking", 2010 47th ACM/EDAC/IEEE Design Automation Conference (DAC 2010), 176-181, 2010.

He, N. et al., "Using Symbolic Simulation and Weakening Abstraction for Formal Verification of Embedded Software", Proceedings of the 10th IASTED International Conference on Software Engineering and Applications, 334-339, 2006.

* cited by examiner

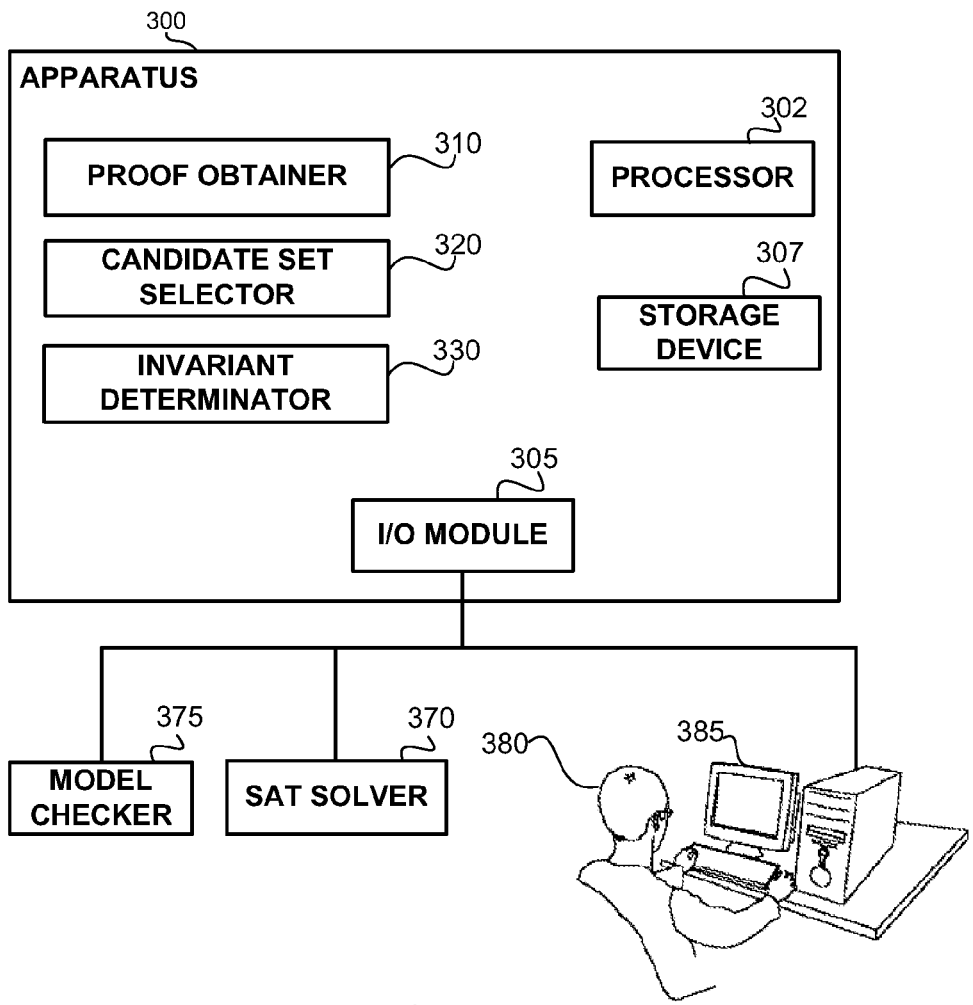
FIG. 3
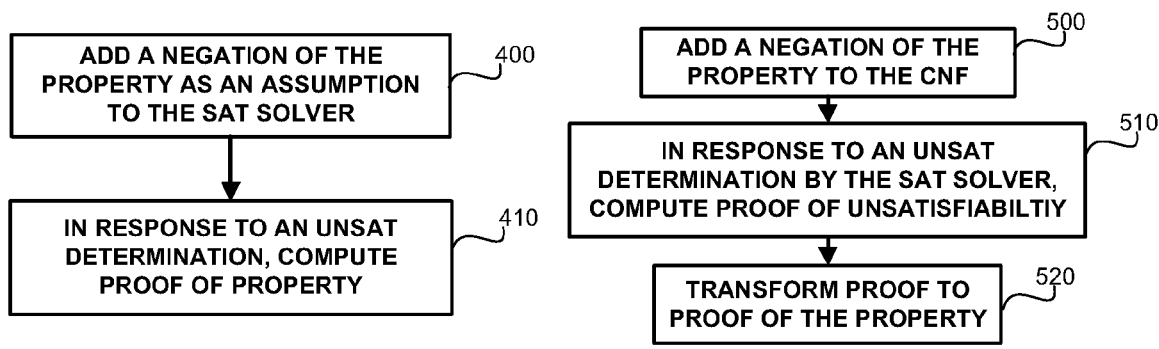
FIG. 4
FIG. 5

IDENTIFYING INVARIANT CANDIDATES BASED ON PROOFS

TECHNICAL FIELD

The present disclosure relates to model checking in general, and to identification of invariant candidates that may be used for model checking, in particular.

BACKGROUND

State of the art computerized components are very complex and require extensive quality assurance checks. One of the commonly used techniques is formal verification in which the computerized component is modeled and is examined by a model checker. The model describes all possible behaviors of the computerized component based on inputs from the environment and calculations performed by the computerized component itself. Most components are represented by cycled models in which the state of the component may differ from one cycle to the other. It will be noted that the computerized component may be a software component, firmware component, hardware component or the like. It will be further noted that in some cases the component to be verified may be a business method, user interaction, communication protocol or any other form of activity or computation that may be expressed formally using a model.

A model checker checks that the model holds a predetermined specification property. An exemplary specification property may be that a triggered event is always handled by the component or that a certain variable is never assigned a predetermined value. The specification property may be attributed to one or more cycles. For simplicity, the current disclosure discusses mainly a specification property that is associated to a cycle. However, it should be understood that the disclosed subject matter is not limited to such a specification property. For example, the specification property may be associated with more than one cycle, such as for example, after a flag is raised in a cycle, an alert is issued within a predetermined number of cycles. In some exemplary embodiments, the property is what is known in the art as safety property, and may be provided using a Property Specification Language (PSL) formula such as AGp, indicating that Always (i.e., in each cycle), Globally (i.e. in each possible scenario), property p holds. Property p may be a property provided in temporal logic.

One form of model checking utilizes a Bounded Model Checker (BMC). The bounded model checker determines whether the specification property holds for a predetermined number of cycles. A bounded model is a model which has a bounded number of cycles. A bounded model associated with an unbounded model may be determined by truncating behaviors of the model in every cycle that exceeds a predetermined bound. While the BMC may falsify the specification property by determining that in a given one or more cycles the specification property is not held, it cannot prove that the specification is held for the model, as the number of cycles is bounded. The BMC can only provide a proof that the specification is held for every cycle within the predetermined number of cycles.

One family of BMC engines utilizes a Boolean satisfiability problem solver, also known as SAT solver, for solving a Boolean satisfiability problem that is associated with the predetermined number of cycles. The Boolean satisfiability problem is formulated in a Conjunctive Normal Form (CNF) formula. A CNF formula of the form $I \wedge TR^K$ may describe a behavior of the bounded model within k steps. I is the initial state, TR is a transition relation from state i to state i+1, k transition relations are utilized to model behavior until cycle k. In some cases, in order to verify the property p, the CNF may correspond to a formula $I \wedge TR^K \wedge \neg p$. In case a satisfying assignment of the CNF is found, the property p is falsified. Otherwise, that SAT solver may prove that there are no satisfying assignments to the CNF. Optionally, the SAT solver may provide a proof of unsatisfiability.

BRIEF SUMMARY

One exemplary embodiment of the disclosed subject matter is a computer-implemented method performed by a computerized device, comprising: obtaining a proof of a property with respect to a bounded model having a bounded number of cycles, wherein the bounded model comprising an initial axiom and a transition relation axiom, wherein the proof of the property is a Directed Acyclic Graph (DAG), wherein each non-leaf node of the DAG is deducible from its child nodes, wherein a root of the DAG is the property, and wherein leaves of the DAG are associated with an axiom of the bounded model; selecting a set of candidate invariants comprising at least one intermediate node of the DAG; determining a subset of the set of candidates, wherein the subset comprises invariants which are held in an unbounded model during each cycle after the bound, wherein the unbounded model is an unbounded version of the bounded model; and utilizing the subset for model checking of the unbounded model.

Another exemplary embodiment of the disclosed subject matter is an apparatus having a processing unit, the apparatus comprising: a proof obtainer operative to obtain a proof of a property with respect to a bounded model having a bounded number of cycles, wherein the bounded model comprising an initial axiom and a transition relation axiom, wherein the proof of the property is a Directed Acyclic Graph (DAG), wherein each non-leaf node of the DAG is deducible from its child nodes, wherein a root of the DAG is the property, and wherein leaves of the DAG are associated with an axiom of the bounded model; a candidate set selector operative to select a set of candidate invariants comprising at least one intermediate node of the DAG; and an invariant determinator operative to determine a subset of the set of candidates, wherein the subset comprises invariants which are held in an unbounded model during each cycle after the bound, wherein the unbounded model is an unbounded version of the bounded model.

Yet another exemplary embodiment of the disclosed subject matter is a computer program product comprising: a non-transitory computer readable medium; a first program instruction for obtaining a proof of a property with respect to a bounded model having a bounded number of cycles, wherein the bounded model comprising an initial axiom and a transition relation axiom, wherein the proof of the property is a Directed Acyclic Graph (DAG), wherein each non-leaf node of the DAG is deducible from its child nodes, wherein a root of the DAG is the property, and wherein leaves of the DAG are associated with an axiom of the bounded model; a second program instruction for selecting a set of candidate invariants comprising at least one intermediate node of the DAG; a third program instruction for determining a subset of the set of candidates, wherein the subset comprises invariants which are held in an unbounded model during each cycle after the bound, wherein the unbounded model is an unbounded version of the bounded model; and wherein said first, second, and third program instructions are stored on said non-transitory computer readable medium.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings:

FIG. 3 shows a block diagram of components of an apparatus useful for identifying and/or utilizing invariant candidates, in accordance with some exemplary embodiments of the disclosed subject matter;

FIG. 4 and FIG. 5 show flowchart diagrams of methods for generating proof of a property, in accordance with some exemplary embodiments of the disclosed subject matter.

DETAILED DESCRIPTION

Figure 1:
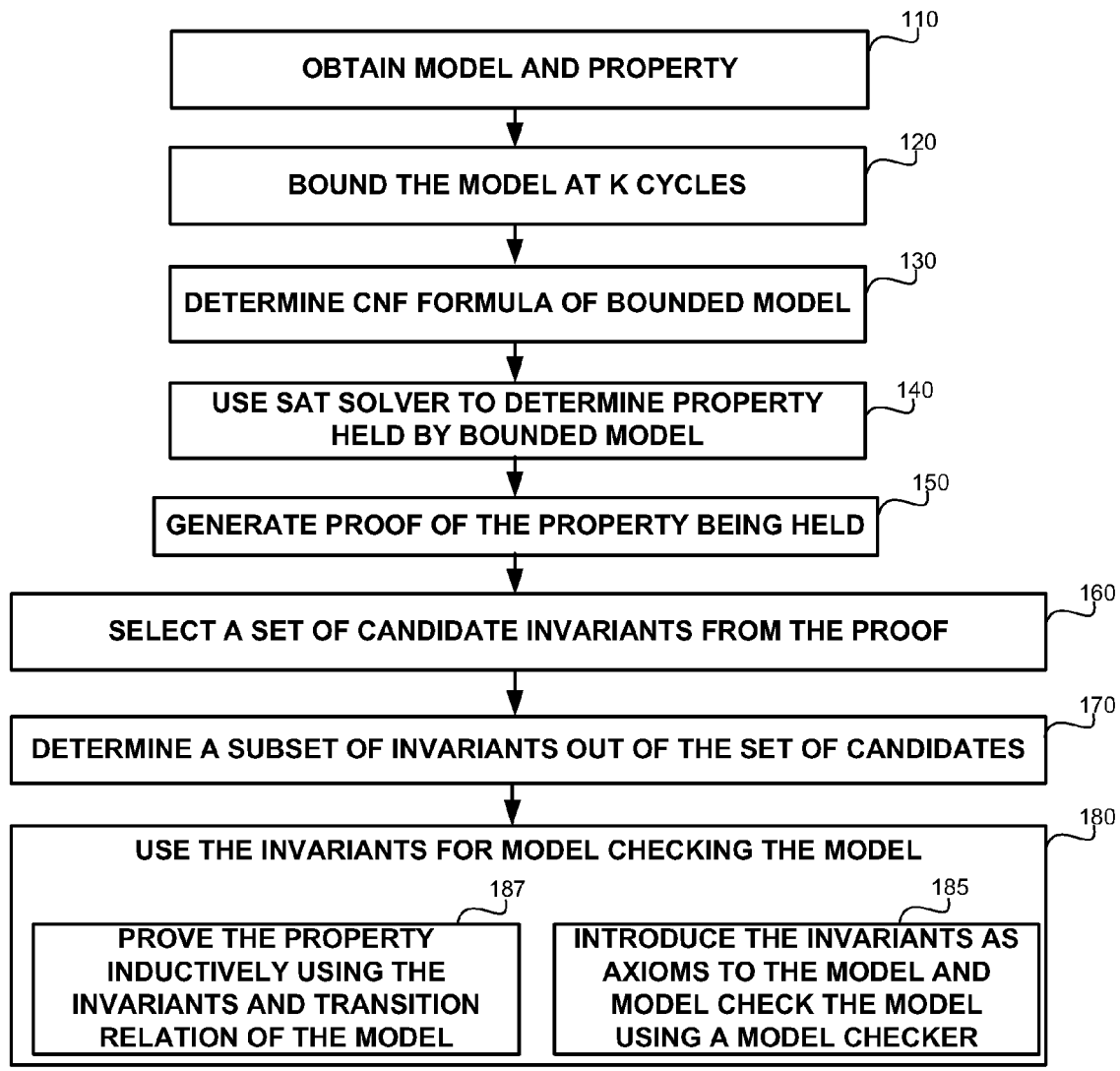
FIG. 1 shows a flowchart diagram of steps in a method for identifying invariant candidates, in accordance with some exemplary embodiments of the disclosed subject matter.

The disclosed subject matter is described below with reference to flowchart illustrations and/or block diagrams of methods, apparatus (systems) and computer program products according to embodiments of the subject matter. It will be understood that blocks of the flowchart illustrations and/or block diagrams, and combinations of blocks in the flowchart illustrations and/or block diagrams, can be implemented by computer program instructions. These computer program instructions may be provided to one or more processors of a general purpose computer, special purpose computer, a tested processor, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transient computer-readable medium that can direct a computer or other programmable data processing apparatus to function in a particular manner, such that the instructions stored in the non-transient computer-readable medium produce an article of manufacture including instruction means which implement the function/act specified in the flowchart and/or block diagram block or blocks.

The computer program instructions may also be loaded onto a device. A computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to determine one or more invariants of a model. An invariant is a property, such as a temporal property, whose value remains unchanged during every state of the model. For example, in a model in which there is a variable v whose value is flipped each cycle, the property v≠next(v), is an invariant. In some exemplary embodiments, there may be invariants that are held for each cycle after a predetermined number of cycles (e.g., not held until cycle 4 and are held from cycle 4 and onwards).

An invariant may be useful in proving that a property is held. In some exemplary embodiments, a model checker may gain a significant performance speedup when proving the property and utilizing one or more invariants. In some exemplary embodiments, proving the property may become feasible due to the utilization of the invariants. Thus, invariants may be useful to overcome state-space explosion problem in some cases.

It will be noted that an invariant may be useful in model checking for non-safety properties as well, such as for example, a liveness property.

Another technical problem is to identify possible candidate properties that may be invariants. The candidates may be properties that are potentially invariant. In some exemplary embodiments, a property-driven candidate identification may be desired, such that the invariants are more likely to be useful in proving (or falsifying) the property. As a naïve example, consider an invariant on variables that have no direct or indirect effect on the variables of the property. Such an invariant is not likely to be useful in proving the property.

One technical solution is to obtain a proof of the property with respect to a bounded model. In some exemplary embodiments, the proof may be generated by a SAT solver, with respect to a formula descriptive of the states of the bounded model. The proof may be based on a determination by the SAT solver that there is no satisfying assignment to the formula that would refute the property. The formula may be provided in Conjunctive Normal Form (CNF). Based on the proof of the property, invariant candidates may be identified.

The CNF is a conjunction of clauses, wherein each clause is a disjunction of literals. A literal is either a true or a false value of a variable. The variables are used to describe the state of the model at each cycle. Assuming that variables x,y,z describe a state of the model, then in a bounded model of k cycles, there will be at 3 times k variables (e.g., $x_1, y_1, z_1, x_2, y_2, z_2, \ldots, x_k, y_k, z_k$) to describe the bounded model.

A proof may be a Directed Acyclic Graph (DAG) describing deductions based on the clauses of the formula which lead to a conclusion, such as that the property is held. A node in the proof is associated with a clause. Leaf nodes in the DAG are associated with clauses in the CNF formula. Non-leaf nodes are deducible from their child nodes. Non-leaf nodes may be, for example, resolution clauses, conflict clauses or any other clause that may be deduced from the child nodes. A root node of the proof is the conclusion of the proof. In some exemplary embodiments, the conclusion may be the property.

Another technical solution is to obtain a proof of unsatisfiability with respect to the formula and a negation of the property. The proof of unsatisfiability may be manipulated to transform it into a proof of the property instead.

Yet another technical solution is to select every node of the proof of the property as a candidate. Alternatively, one can select a set of nodes corresponding to some set of nodes, referred to as a cut in the proof, as candidates. The proof ensures that the property can be deduced from this set of nodes. In some exemplary embodiments, this cut might be a minimal cut, or a minimal cut with additional candidates selected.

Yet another technical solution is to determine which subset of the candidates is an invariant. The invariants may be utilized for model checking. In some exemplary embodiments, the property is selected as a candidate and a determination that the property is indeed an invariant is used to indicate that the property holds on the model.

One technical effect of utilizing the disclosed subject matter is a property-driven manner of determining invariants, thus increasing likelihood that the invariants are useful for proving that the property holds on the model.

Another technical effect of utilizing the disclosed subject matter is potentially gaining a speedup in model checking, by introducing the invariants of the model. Additionally or alternatively, proving a property that could not have been proven with a predetermined set of resources (e.g., memory space, processing capabilities, time), may be feasible due to the determined invariants.

Yet another technical effect is determining invariants with limited overhead processing. BMC determination may be a part of model checking process of an unbounded model. The proof of the property may be constructed using relatively a small amount of added resources (e.g., linear time transformation and/or construction of a proof, based on a determination of UNSAT by a SAT solver), while possibly determining a useful set of invariants for model checking the unbounded model.

Yet another technical effect is that invariants are determined in a non-simulation-based approach, thereby invariants that are identified are not random and/or irrelevant of the property, but rather associated to the property.

Referring now to FIG. 1 showing a flowchart diagram of steps in a method for identifying invariant candidates, in accordance with some exemplary embodiments of the disclosed subject matter.

In step 110, a model and a property may be obtained. The model may be a descriptive model of operation of a computerized device, such as a hardware or software component. In some exemplary embodiments, the model may describe operation of a communication protocol, business method or the like. In some exemplary embodiments, the model describe states in discrete cycles, such as for example, clocking cycles of a CPU, turns in a communication protocol, or the like. In some exemplary embodiments, the model may be unbounded, such that it may describe a state after any number of cycles.

In some exemplary embodiments, a state of the model may be defined using a set of variables. A transition relation may define a change from a cycle to a next cycle, based on the current state and the input. A set of one or more initial states may be provided defining potential initial states of the model. In some exemplary embodiments, the model may be depicted using a descriptive language such as SystemC, Hardware Description Language (HDL), Verilog, Property Specification Language (PSL) or the like.

In step 120, a bound k on the model may be determined In some exemplary embodiments, the bound may be determined based on a determination by the user, based on the diameter of the model, based on preferences, rules and configurations, or the like. The bound may be used to determine a bounded version of the model.

In step 130, a CNF formula of the bounded model may be determined. The CNF formula may correspond to: $I \wedge \bigcap_{i=1..k} TR_i$. Assuming that a state may be described using a set of Boolean variables, the CNF formula may utilize k replicas of the set to describe the state at each cycle. Thus, the transition relation defines transition relation axioms of how the state in cycle i+1 is defined based on the state in cycle i and optionally based on given inputs in cycle i. Set of inputs may also be replicated for each cycle. It will be noted that a transition relation may be a function defined: $TR_i: \{in_i^1, \ldots, in_i^n, v_i^1, \ldots, v_i^m\} \rightarrow \{v_{i-1}^1, \ldots, v_{i+1}^m\}$, where $in_z^w$ is an input signal number w (out of n input signals) in cycle z, where $v_z^w$ is a state variable number w (out of m state variables) in cycle z. However, although each TR function differs in the variables it refers to (e.g., input signals and state variables of current state and state variables of next state), it may define the same relation from each state to the next state, and for simplicity purposes may be referred to as TR. Therefore, the formula may be referred to as $I \wedge TR^k$. In some exemplary embodiments, a clause associated with I may be referred to as an initial axiom. Additionally or alternatively, a clauses associated with the TR may be referred to as a transition relation axiom.

In some exemplary embodiments, the formula may be modified in accordance with other BMC techniques, such as for example, assuming the simple-path constraint, or the like.

In step 140, a SAT solver may be used to determine whether the property is held by the bounded model. The SAT solver may be an apparatus, implemented in hardware, software, firmware, combination thereof, or the like, operative to determine a satisfying assignment of a Boolean satisfiability problem, or, alternatively, indicate that no such satisfying assignment exists. In some exemplary embodiments, the SAT solver may be, as a non-limiting example, Chaff, disclosed in Matthew W. Moskewicz, et al, "Chaff: engineering an efficient SAT solver", Proceedings of the 38th conference on Design automation, p. 530-535, 2001, which is hereby incorporated by reference, MiniSat, disclosed in Niklas Een et al, "An Extensible SAT-solver ", SAT 2003, which is hereby incorporated by reference, or the like. In some exemplary embodiments, a SAT solver may implement the Davis-Putnam-Logemann-Loveland algorithm (DPLL) algorithm, or the like.

In some exemplary embodiments, the SAT solver may be provided with a CNF formula that incorporates a negation of the property. The CNF may correspond to $I \wedge TR^k \wedge \neg p$. A determination of unsatisfiability by the SAT solver of the CNF corresponds to a determination that the bounded model adheres to the property p. Additionally or alternatively, the CNF may correspond to $I \wedge TR^k$ and the SAT solver may be instructed to assume that p is not held (i.e., assume $\neg p$). The instruction to assume may be provided by providing one or more unit clauses that should be true. A unit clause is a clause comprising exactly one literal, and thus enforces a specific value on a variable (either true or false). A SAT solver that supports assumptions, such as, for example, MiniSat, may be adapted to choose values in accordance with unit clauses before a process of solving the SAT problem commences. In some exemplary embodiments, deductions by the SAT solver are independent of such solutions, and therefore all deductions (e.g., conflict clauses, resolution clauses, or the like) are correct even in case the assumption would not have been taken.

In some exemplary embodiments, in case the property $\neg p$ is not a unit clause, an auxiliary property aux may be introduced and utilized. A non-unit clause $(aux \vee \neg p)$ may be added to the CNF, and the unit clause $(\neg aux)$ may be assumed, thereby implying $\neg p$ in the CNF.

In step 150, a proof of the property may be constructed. The proof of the property may be constructed directly by the SAT solver. Additionally or alternatively, the proof of the property may be based on a proof of unsatisfiability constructed by the SAT solver. In some exemplary embodiments, alternative manners in which the proof can be constructed may be utilized. It will be noted that in some instances, an external component may be utilized for the constructing a proof, instead of the SAT solver, such as the case when the SAT solver itself does not support construction of proofs. However, for simplicity, such an external component may be considered as part of the SAT solver itself.

In some exemplary embodiments, the proof may be manipulated, such as by reordering clauses of the proof. It will be noted that reordering of clauses within a proof may comprise modification of the clauses in the proof. Oded Fuhrmann, Shlomo Hoory, "On Extending Bounded Proofs to Inductive Proofs", CAV 2009, which is hereby incorporated by reference, discloses one method of reordering clauses of the proof. Additionally or alternatively, other reordering procedures may be applied. In some instances, proof manipulation may be useful in generating better candidate invariants to be used in accordance with the disclosed subject matter.

In step 160, out of the proof of the property a set of clauses may be selected as candidate invariants. In some exemplary embodiments, all clauses in the proof may be selected as candidates. In some exemplary embodiments, all non-leaf nodes may be selected. Additionally or alternatively, a cut in the proof may be selected. Additionally or alternatively, in addition to the cut, one or more additional clauses may be selected.

In some exemplary embodiments, a cycle annotation may be ignored when selecting candidates. Therefore, the clauses $(x_3 \vee y_4)$ and $(x_7 \vee y_8)$ may be considered the same candidate as both refer to value of x variable in a cycle, and value of y variable in next cycle. In some exemplary embodiments, candidates may be dependent on values of a plurality of variables in the same cycle, values of variables from different cycles that are not immediately consecutive of each other, or the like.

In step 170, a subset of the invariants may be identified as actual invariants that are held during each cycle of the model. In some exemplary embodiments, a subset S may be selected and a test of its correctness may be performed, such as by utilizing a SAT solver to determine whether there is an assignment for the formula: $TR \wedge S \rightarrow \neg S'$, where TR is the transition relation from a cycle to a next cycle and S is the subset of candidates being checked, and S' is the subset of invariants for the next cycle. A satisfying assignment refutes one or more invariant candidate comprised by S, which may be removed, and the reduced subset may be then checked in a similar manner Alternatively, a determination of unsatisfiability may be indicative that all candidates within S are invariants.

In some exemplary embodiments, an invariant candidate may be a combinatorial invariant candidate. A combinatorial invariant candidate refers to literals of variables associated with the same cycle (e.g., the clause $(x_{10} \vee \neg y_{10} \vee z_{10} \vee \neg w_{10})$). For combinatorial invariant candidates referring to cycle i, $TR_i \wedge S \rightarrow \neg S'$ may be examined. In case S comprises combinatorial invariant candidates associated with different cycles, TRs of the different cycles may be introduced to the formula.

In some exemplary embodiments, an invariant candidate may be a temporal invariant candidate. A temporal invariant candidate describes a relationship between variables of different cycle (e.g., $(x_4 \vee \neg y_7 \vee \neg z_5)$). For temporal invariant candidates TRs of the cycles in between the lowest and highest cycle may be introduced (e.g., with respect to the example above, the formula may be: $TR_4 \wedge TR_5 \wedge TR_6 \wedge TR_7 \wedge S \rightarrow \neg S'$. In case S comprises temporal invariant candidates associated with different cycles, TRs of the different cycles may be introduced.

In some exemplary embodiments, some candidates are temporal invariant candidates and some are combinatorial temporal invariants. The TRs of all relevant cycles may be introduced to the formula. In some exemplary embodiments, if the highest cycle being referred to is j, the formula may be: $TR^j \wedge S \rightarrow \neg S'$.

It will be noted, that although $TR \wedge S \rightarrow \neg S'$ may be unsatisfiable, individual examination of each candidate $C \in S$ may yield that $TR \wedge C \rightarrow \neg C'$ is satisfiable (for example, in case that the proof of the invariant C is based on another invariant). Thus, choosing a set of candidates to be checked together may be useful in proving more invariants.

Concurrently to filing of the Present Application, Applicants are filing an additional application, titled "DETERMINING INVARIANTS IN A MODEL", which is hereby incorporated by reference, disclosing a manner to determine the subset S of invariants out of the set of candidates.

In step 180, the invariants may be used for model checking the model. In some exemplary embodiments, the invariants may be used for model checking the model with respect to the property. Additionally or alternatively, the invariants may be used for model checking alternative or additional properties. In some exemplary embodiments, in case the property is determined to be an invariant (e.g., the property may be added as a candidate in step 160, and verified as an invariant in step 170), an immediate determination that the property is held by the model may be provided.

In some exemplary embodiments, step 185 may be performed. In step 185, the invariants may be introduced as axioms to the model. The modified model may be modeled checked with respect to the property and/or other properties.

In some exemplary embodiments, step 187 may be performed. In step 187, the property may be proven inductively using the invariants and transition relation. The inductive proof may be established by proving that if the property is held in a first cycle, then it will be held in the next cycle as well. For example, a SAT solver may be given a CNF associated with the following formula: $TR \wedge INVARs \wedge p \rightarrow \neg p'$, where INVARs are the invariants, p is the property and p' is characterization of the property for the next state. A determination that there is no satisfying assignment may indicate that the property is always held. In some exemplary embodiments, the inductive proof may be associated with several cycles and not a single cycle, such as by including TR of the several cycles.

Figure 2A:
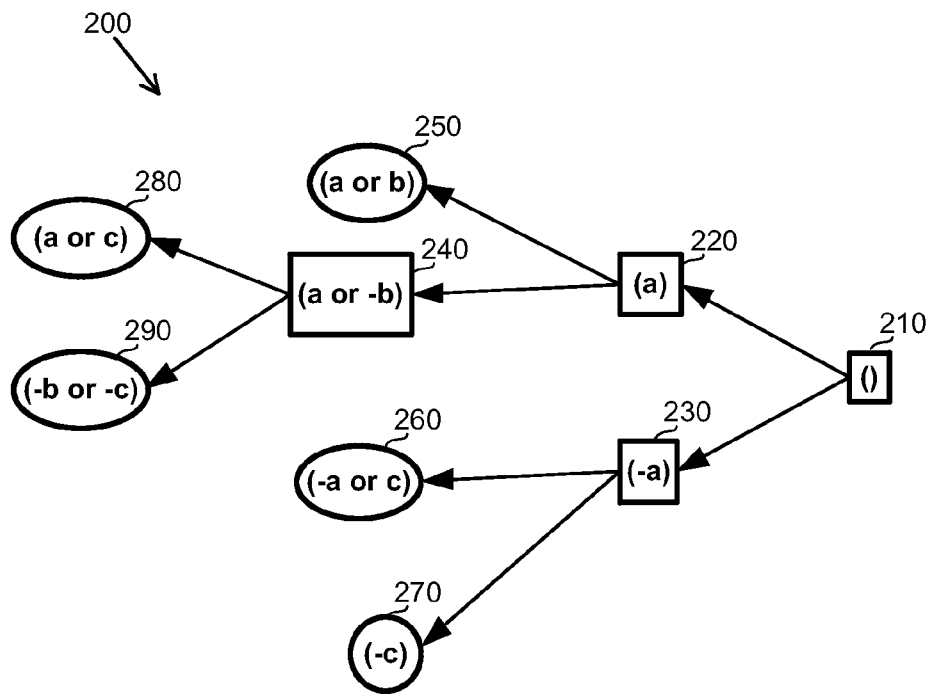
FIG. 2A shows a diagram of a proof of unsatisfiability, in accordance with some exemplary embodiments of the disclosed subject matter.

Referring now to FIG. 2A showing a proof of unsatisfiability, in accordance with some exemplary embodiments of the disclosed subject matter.

The proof of unsatisfiability 200 is a DAG (and not necessarily a tree, as in the figure). Each node of the proof is associated with a clause. Leaf nodes are clauses from the CNF formula (e.g., init axioms, transition relation axiom, or property). For example, the property may have been c, and therefore the negation of the property ($\neg c$) is a leaf 270. Based on two or more clauses, a deduction clause may be provided, such as a resolution clause, a conflict clause, or the like. For example, based on leaf nodes 260 and 270, a deduction clause ($\neg a$) is determined in intermediate node 230. Resolution clause between nodes 220 and 230 is the empty clause which is the conclusion of the proof and set as the root 210. In the proof, every non-leaf node is deducible from its child nodes. For example, node 220 is deducible from nodes 240 and 250. Node 240 is deducible from nodes 280 and 290. In some exemplary embodiments, a SAT solver is adapted to construct the proof of unsatisfiability, after a determination of unsatisfiability. The proof 200 may comprise a portion, and potentially a small portion, of the clauses in the CNF formula, as it may comprise only those clauses and deducible clauses that take part in proving the CNF formula unsatisfiable.

Figure 2B:
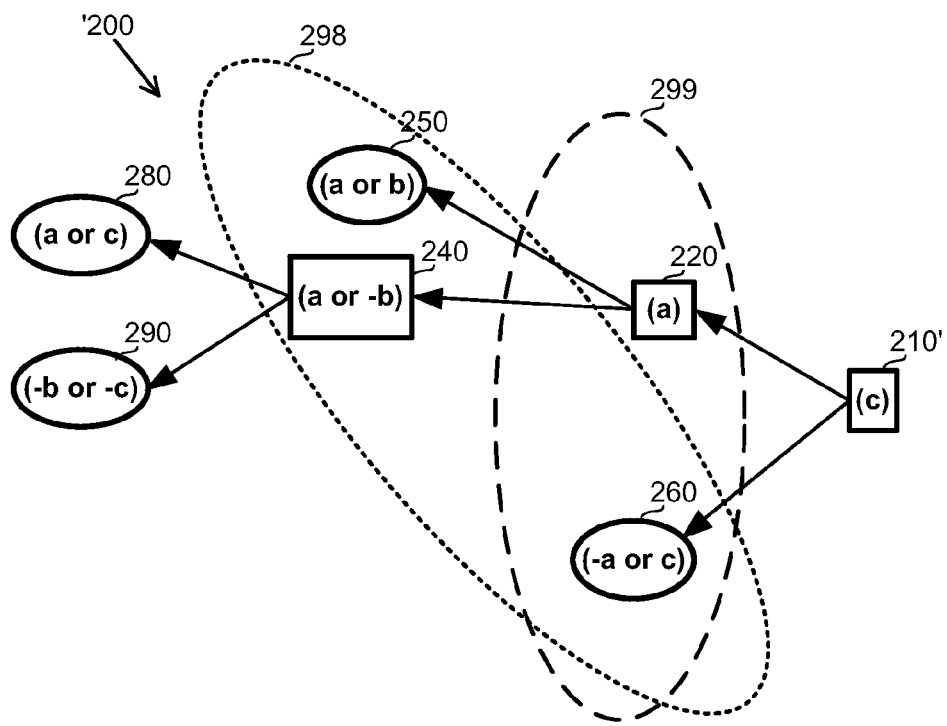
FIG. 2B shows a diagram of a proof of a property corresponding to the proof of unsatisfiability of FIG. 2A, in accordance with some exemplary embodiments of the disclosed subject matter.

Referring now to FIG. 2B showing a proof of the property, in accordance with some exemplary embodiments of the disclosed subject matter.

In some exemplary embodiments, a proof of the property 200' may be constructed. In some exemplary embodiments, the proof of the property 200' may be constructed directly by the SAT solver. Additionally or alternatively, the proof of the property 200' may be constructed by first constructing the proof of unsatisfiability 200 and transforming it to a proof of the property 200', such as by performing linear-time manipulation of the proof.

In some exemplary embodiments, the proof of the property 200' provides a proof that the property is held. The root, comprising a conclusion of the proof, comprises a clause which implies the property. In the exemplary proof, root node 210' comprises (c).

In some exemplary embodiments, the property may be a non-unit clause. As a naïve solution, a new single output variable may be introduced. The output variable may be configured to be true if and only if the property is held. Thus, the output variable may be utilized as the property, and can be introduced using unit clause. It will be noted, however, that other solutions to non-unit clauses may exist, and would be obvious to a person of ordinary skill in the art in view of the disclosed subject matter.

In some exemplary embodiments, proof 200 may be transformed to proof 200' by performing manipulations. A leaf node associated with a negation of the property (i.e., node 270 of the proof 200) may be removed. Deductions made based on this leaf node may be modified. For example, assuming the leaf node is ($\neg p$) deductions ($lit_1 \vee lit_2 \vee \ldots \vee lit_m$) (i.e., any clause) made based on the leaf node may be modified to be ($lit_1 \vee lit_2 \vee \ldots \vee lit_m \vee p$). In some exemplary embodiments, each node in the path from the root to the leaf node 270, including the root node, may be modified and thus now contain the property clause. In some exemplary embodiments, only a portions of the nodes is modified. For example, the property may be added depending on whether the variable p is reintroduced in the proof later on.

In some exemplary embodiments, assuming the BMC model is valid (e.g., there is an initial state, and for each state, a next state is defined), unsatisfiability is due to the assumption that the property does not hold. Therefore the BMC model implies that the property holds. The proof of unsatisfiability, when clauses associated with the property are removed from leaf nodes, is guaranteed to deduce that the property holds. Otherwise, the negation of the property would not have causes the CNF to be unsatisfiable. Propagation of a negation of the leaf node to root is disclosed in Satrajit Chatterjee, Alan Mishchenko, Robert K. Brayton, Andreas Kuehlmann: On Resolution Proofs for Combinational Equivalence. DAC 2007: 600-605, which is hereby incorporated by reference. Chatterjee et al discloses linear-time transformations of the proof of unsatisfiability that may be used to yield the proof of the property.

In some exemplary embodiments, the proof 200' may be constructed directly by the SAT solver. A SAT solver adapted to receive an assumption may be configured to choose values in accordance with the assumptions, until a conflict occurs with the assumptions. As the assumptions are not axioms and may be removed later on, a proof constructed by the SAT solver generally cannot rely on the assumptions. Hence, the proof would not include leaf nodes such as 270 of FIG. 2A. The solver may be able to construct a proof that the assumption is refuted, i.e., that the property is held.

A cut in a proof is a collection S of nodes, such that each path from a leaf node to the root necessarily passes through a node in S. In some exemplary embodiments, all non-leaf nodes in the cut follow from $I \wedge TR^K$, and thus hold on one of the first k states of the model. In some exemplary embodiments, each cut in the proof is sufficient to deduce the conclusion. For example, cut 299 comprises two clauses 220 and 260 from which clause 210' can be deduced directly. As another example, cut 298 comprises nodes 240, 250, 260, from which clause 210' can be deduced indirectly, by first deducing clause 220.

A clause in a proof of the property may be an invariant candidate. In some exemplary embodiments, all clauses in the proof 200' may be selected as invariant candidates. In some exemplary embodiments, a cut comprising at least one non-leaf node may be selected as candidates. In some exemplary embodiments, in addition to the cut additional nodes may be selected, such as nodes that are deducible from the cut (e.g., node 220 with respect to cut 298). Additionally or alternatively, a collection of clauses may be selected from the proof of the property based on a heuristic choice.

Referring now to FIG. 3 showing a block diagram of components of an apparatus useful for identifying and/or utilizing invariant candidates, in accordance with some exemplary embodiments of the disclosed subject matter. An apparatus 300 may be a computerized apparatus adapted to perform a method such as depicted in FIG. 1.

In some exemplary embodiments, apparatus 300 may comprise a processor 302. Processor 302 may be a Central Processing Unit (CPU), a microprocessor, an electronic circuit, an Integrated Circuit (IC) or the like. Alternatively, apparatus 300 can be implemented as firmware written for or ported to a specific processor such as Digital Signal Processor (DSP) or microcontrollers, or can be implemented as hardware or configurable hardware such as field programmable gate array (FPGA) or application specific integrated circuit (ASIC). Processor 302 may be utilized to perform computations required by apparatus 300 or any of it subcomponents.

In some exemplary embodiments of the disclosed subject matter, apparatus 300 may comprise an Input/Output (I/O) device 305 such as a terminal, a display, a keyboard, an input device or the like to interact with the system, to invoke the system and to receive results. It will however be appreciated that the system can operate without human operation.

In some exemplary embodiments, the I/O module 305 may be utilized to provide an interface to a user 380, which may utilize a Man-Machine Interface (MMI) 385 to interact with the apparatus 300, such as by reviewing results, logs and the like, providing commands, rules, preferences, formulas or the like, or interacting in any similar manner Additionally or alternatively, the I/O module 305 may be utilized to interface to a SAT solver 370. The SAT solver 370 may be a third-party SAT solver used as a black-box, an off-the-shelf SAT solver, a specialized SAT solver, or the like.

Additionally or alternatively, the I/O module 305 may be utilized to interface to a model checker 375. The model checker 375 may be a third-party model checker, an off-the-shelf model checker, a specialized model checker, or the like. The model checker 375 may be configured to model check the unbounded model using the invariants determined by the apparatus 300.

In some exemplary embodiments, apparatus 300 may comprise one or more storage devices such as storage device 307. Storage device 307 may be persistent or volatile. For example, storage device 307 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, storage device 307 may retain program code operative to cause processor 302 to perform acts associated with any of the steps shown in FIG. 1 above.

The components detailed below may be implemented as one or more sets of interrelated computer instructions, executed for example by processor 302 or by another processor. The components may be arranged as one or more executable files, dynamic libraries, static libraries, methods, functions, services, or the like, programmed in any programming language and under any computing environment.

The apparatus 300 may comprise a proof obtainer 310. The proof obtainer 310 may be configured to obtain a proof of a property. In some exemplary embodiments, the proof obtainer 310 may be configured to generate the proof of the property based on proof of unsatisfiability. In some exemplary embodiments, the proof obtainer 310 may be configured to obtain the proof from another module, such as a SAT solver. In some exemplary embodiments, the proof obtainer 310 may be configured to perform step 150 of FIG. 1.

A candidate set selector 320 may be operative to select a set of candidate invariants. In some exemplary embodiments, the candidates may be selected from the proof of the property obtained by the proof obtainer 310. In some exemplary embodiments, the candidate set selector 320 may be adapted to perform step 160 of FIG. 1.

An invariant determinator 330 may be operative to determine a subset of invariants out of the candidates. In some exemplary embodiments, the subset may be a strict subset of the candidates. Additionally or alternatively, all candidates may be proven to be invariants and the set may be equal to the set of candidates. In some exemplary embodiments, the invariant determinator 330 may be adapted to perform step 170 of FIG. 1.

Referring now to FIG. 4 showing a flowchart diagram of a method for generating proof of a property, in accordance with some exemplary embodiments of the disclosed subject matter.

In step 400, a negation of the property is added as an assumption to the SAT solver. The SAT solver may operate and determine that the formula is unsatisfiable, thus proving the property is held in the bounded model. The SAT solver may be instructed to determine satisfiability of a CNF formula determined in step 130 of FIG. 1, such as $I \wedge TR^k$.

In step 410, in response to the UNSAT determination, the SAT solver may compute the proof of the property. As the negation of the property is merely an assumption, and as this assumption is involved in the UNSAT determination, the proof may refute the assumption (or a portion thereof). Thus the proof constructed by the SAT solver is the proof of the property, such as 200' of FIG. 2B.

Referring now to FIG. 5 showing a flowchart diagram of a method for generating proof of a property, in accordance with some exemplary embodiments of the disclosed subject matter.

In step 500, a negation of the property is added to the CNF of step 130. Hence, the modified CNF may be $I \wedge TR^k \wedge \neg p$. The SAT solver may be instructed to determine satisfiability of the modified CNF.

In step 510, in response to an UNSAT determination, the SAT solver may compute the proof of unsatisfiability, such as 200 of FIG. 2A.

In step 520, the proof may be transformed into proof of the property, such as 200' of FIG. 2B. Transformation may be performed using linear-time manipulation of the proof.

The flowchart and block diagrams in the figures illustrate the architecture, functionality, and operation of possible implementations of systems, methods and computer program products according to various embodiments of the present disclosure. In this regard, each block in the flowchart and some of the blocks in the block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", an and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, any non-transitory computer-readable medium, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method performed by a computerized device, comprising:
    obtaining a proof of a property with respect to a bounded model having a bounded number of cycles, wherein the bounded model comprising an initial axiom and a transition relation axiom, wherein the proof of the property is a Directed Acyclic Graph (DAG), wherein each non-leaf node of the DAG is deducible from its child nodes, wherein a root of the DAG is the property, and wherein leaves of the DAG are associated with an axiom of the bounded model;
    selecting a set of candidate invariants comprising at least one intermediate node of the DAG;
    determining, without using the proof and using a Boolean satisfiability problem solver, a subset of the set of candidates, wherein the subset comprises invariants which are held in an unbounded model during each cycle after the bound, wherein the unbounded model is an unbounded version of the bounded model; and
    utilizing the subset for model checking of the unbounded model.

2. The computer-implemented method of claim 1, wherein said obtaining comprises:
    utilizing a Boolean satisfiability problem solver to determine that there is no scenario in which the bounded model does not hold the property; wherein the Boolean satisfiability problem solver is configured to utilize an assumption; and wherein said utilizing the solver comprises: providing the solver with a formula based on the bounded model and an assumption that the property is not held; and
    constructing, by the solver, the proof of the property.

3. The computer-implemented method of claim 1, wherein said obtaining comprises:
    utilizing a Boolean satisfiability problem solver to determine that there is no scenario in which the bounded model does not hold the property; wherein said utilizing the solver comprises: providing the solver with a formula based on the bounded model and the property;
    constructing, by the solver, a proof of unsatisfiability, wherein the proof of unsatisfiability comprises a leaf node corresponding to a negation of the property; and
    transforming the proof of unsatisfiability to the proof of the property.

4. The computer-implemented method of claim 3, wherein said transforming comprises performing linear-time transformations on the proof of unsatisfiability to determine the proof of the property.

5. The computer-implemented method of claim 1, wherein said utilizing the subset comprises: adding the invariants to the unbounded model; and model checking the modified unbounded model.

6. The computer-implemented method of claim 1, wherein said utilizing the subset comprises: using the invariants to prove the property is held inductively, wherein the property is held inductively if based on a cycle that holds the property, a successive cycle holds the property.

7. The computer-implemented method of claim 1:
    wherein said selecting comprises adding the property as a candidate;
    wherein said determining the subset comprises verifying the property is an invariant; and
    wherein said utilizing the subset comprises, based on said verifying the property is an invariant, indicating that the property is held by the unbounded model.

8. The computer-implemented method of claim 1, wherein said selecting comprises selecting substantially all nodes as invariant candidates.

9. The computer-implemented method of claim 1, wherein said selecting comprises selecting a cut of the proof of the property.

10. An apparatus comprising:
    a processing unit;
    a proof obtainer operative to obtain a proof of a property with respect to a bounded model having a bounded number of cycles, wherein the bounded model comprising an initial axiom and a transition relation axiom, wherein the proof of the property is a Directed Acyclic Graph (DAG), wherein each non-leaf node of the DAG is deducible from its child nodes, wherein a root of the DAG is the property, and wherein leaves of the DAG are associated with an axiom of the bounded model;
    a candidate set selector operative to select a set of candidate invariants comprising at least one intermediate node of the DAG; and
    an invariant determinator operative to determine, without using the proof and using a Boolean satisfiability problem solver, a subset of the set of candidates, wherein the subset comprises invariants which are held in an unbounded model during each cycle after the bound, wherein the unbounded model is an unbounded version of the bounded model.

11. The apparatus of claim 10 further comprising a model checker operative to model check the unbounded model with respect to the property, wherein said model checker is operative to utilize the subset of invariants determined by said invariant determinator.

12. The apparatus of claim 11, wherein the model checker is operative to utilize the invariants to prove the property is held inductively, wherein the property is held inductively if based on a cycle that holds the property, a successive cycle holds the property.

13. The apparatus of claim 10, wherein said proof obtainer is operative to:
utilize a Boolean satisfiability problem solver to determine that there is no scenario in which the bounded model does not hold the property; wherein the Boolean satisfiability problem solver is configured to utilize an assumption; and wherein said utilizing the solver comprises: providing the solver with a formula based on the bounded model and an assumption that the property is not held; and
construct, by the solver, the proof of the property.

14. The apparatus of claim 10, wherein said proof obtainer is operative to:
utilize a Boolean satisfiability problem solver to determine that there is no scenario in which the bounded model does not hold the property; wherein said utilizing the solver comprises: providing the solver with a formula based on the bounded model and the property;
construct, by the solver, a proof of unsatisfiability, wherein the proof of unsatisfiability comprises a leaf node corresponding to a negation of the property; and
transform the proof of unsatisfiability to the proof of the property.

15. The apparatus of claim 10, wherein said candidate set selector is operative to add the property as a candidate, wherein said invariant determinator is operative to verify that the property is an invariant.

16. The apparatus of claim 10, wherein said candidate set selector is operative to select substantially all nodes as invariant candidates.

17. A computer program product comprising:
a non-transitory computer readable medium;
a first program instruction for obtaining a proof of a property with respect to a bounded model having a bounded number of cycles, wherein the bounded model comprising an initial axiom and a transition relation axiom, wherein the proof of the property is a Directed Acyclic Graph (DAG), wherein each non-leaf node of the DAG is deducible from its child nodes, wherein a root of the DAG is the property, and wherein leaves of the DAG are associated with an axiom of the bounded model;
a second program instruction for selecting a set of candidate invariants comprising at least one intermediate node of the DAG;
a third program instruction for determining, without using the proof and using a Boolean satisfiability problem solver, a subset of the set of candidates, wherein the subset comprises invariants which are held in an unbounded model during each cycle after the bound, wherein the unbounded model is an unbounded version of the bounded model; and
wherein said first, second, and third program instructions are stored on said non-transitory computer readable medium.

18. The computer program product of claim 17, further comprising:
a fourth program instruction for utilizing the subset for model checking of the unbounded model; and
wherein said fourth program instruction is stored on said non-transitory computer readable medium.

19. The computer program product of claim 17, further comprising:
a fourth program instruction for utilizing a Boolean satisfiability problem solver to determine that there is no scenario in which the bounded model does not hold the property; wherein the Boolean satisfiability problem solver is configured to utilize an assumption; and wherein said fourth program instruction is operative to provide the solver with a formula based on the bounded model and an assumption that the property is not held;
a fifth program instruction for instructing the solver to construct the proof of the property; and
wherein said fourth and fifth program instructions are stored on said non-transitory computer readable medium.

20. The computer program product of claim 17, further comprising:
a fourth program instruction for utilizing a Boolean satisfiability problem solver to determine that there is no scenario in which the bounded model does not hold the property; wherein said fourth program instruction is operative to provide the solver with a formula based on the bounded model and the property;
a fifth program instruction for instructing the solver to construct a proof of unsatisfiability, wherein the proof of unsatisfiability comprises a leaf node corresponding to a negation of the property;
a sixth program instruction for transforming the proof of unsatisfiability to the proof of the property; and
wherein said fourth, fifth and sixth program instructions are stored on said non-transitory computer readable medium.

* * * * *